United States Patent
Nam

(10) Patent No.: US 10,559,539 B2
(45) Date of Patent: Feb. 11, 2020

(54) WAFER LEVEL PACKAGES, SEMICONDUCTOR DEVICE UNITS, AND METHODS OF FABRICATING THE SAME

(71) Applicant: SK hynix Inc., Icheon-si, Gyeonggi-do (KR)

(72) Inventor: Jong Hyun Nam, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/816,313

(22) Filed: Nov. 17, 2017

(65) Prior Publication Data

US 2018/0286818 A1 Oct. 4, 2018

(30) Foreign Application Priority Data

Apr. 4, 2017 (KR) .................. 10-2017-0043572

(51) Int. Cl.
| | |
|---|---|
| *H01L 23/00* | (2006.01) |
| *H01L 23/538* | (2006.01) |
| *H01L 23/31* | (2006.01) |
| *H01L 21/56* | (2006.01) |

(52) U.S. Cl.
CPC .......... *H01L 23/562* (2013.01); *H01L 21/565* (2013.01); *H01L 23/3128* (2013.01); *H01L 23/3157* (2013.01); *H01L 23/5386* (2013.01); *H01L 2224/18* (2013.01)

(58) Field of Classification Search
None
See application file for complete search history.

(56) References Cited

U.S. PATENT DOCUMENTS

| | | | |
|---|---|---|---|
| 7,863,096 B2 | 1/2011 | England | |
| 9,478,504 B1* | 10/2016 | Shen | ................. H01L 23/49838 |
| 2006/0270106 A1* | 11/2006 | Chiu | ....................... H01L 23/36 438/106 |
| 2008/0315375 A1* | 12/2008 | Eichelberger | ....... H01L 21/6835 257/659 |
| 2009/0298236 A1* | 12/2009 | Dang | .................. H01L 23/3736 438/121 |
| 2011/0147916 A1* | 6/2011 | Su | ........................... H01L 21/54 257/692 |
| 2013/0307128 A1* | 11/2013 | Lin | ....................... H01L 23/552 257/659 |
| 2014/0264821 A1* | 9/2014 | Tang | ..................... H01L 23/367 257/713 |
| 2018/0061788 A1* | 3/2018 | Chang | ..................... H01L 24/04 |

FOREIGN PATENT DOCUMENTS

KR 1020150092252 A 8/2015

* cited by examiner

*Primary Examiner* — Herve-Louis Y Assouman
(74) *Attorney, Agent, or Firm* — William Park & Associates Ltd.

(57) ABSTRACT

A wafer level package and or a semiconductor device unit may be provided. The wafer level package may include semiconductor chips disposed on an interconnection structure layer and laterally spaced apart from each other. The wafer level package may include a reinforcement zig attached to the semiconductor chips. The wafer level package may include a molded layer covering the semiconductor chips and embedding the reinforcement zig. Related methods are also provided.

17 Claims, 8 Drawing Sheets

WAFER LEVEL PACKAGES, SEMICONDUCTOR DEVICE UNITS, AND METHODS OF FABRICATING THE SAME

CROSS-REFERENCE TO RELATED APPLICATIONS

The present application claims priority under 35 U.S.C 119(a) to Korean Application No. 10-2017-0043572, filed on Apr. 4, 2017, which is incorporated herein by references in its entirety.

BACKGROUND

1. Technical Field

Embodiments of the present disclosure may generally relate to package technologies and, more particularly, to wafer level packages, semiconductor device units, and methods of fabricating the same.

2. Related Art

In semiconductor package technologies, fan-out wafer level packages (FOWLPs) are increasingly in demand with the development of smaller electronic systems or products. According to the FOWLPs, input/output (I/O) terminals may be disposed on an outside region of a chip included in each of the FOWLPs. Thus, a size of the chip may be reduced, and a standardized ball layout may be used in the FOWLPs. Hence, the FOWLPs may be widely employed in mobile products. The FOWLPs may be employed in the mobile products without using any printed circuit board (PCB). Accordingly, thin and compact mobile products may be realized using the FOWLPs. However, a warpage phenomenon and a chip shift phenomenon have to be solved to fabricate reliable FOWLPs.

SUMMARY

According to an embodiment, a wafer level package may be provided. The wafer level package may include semiconductor chips disposed side-by-side on an interconnection structure layer. The wafer level package may include a reinforcement zig attached to the semiconductor chips. The wafer level package may include a molded layer covering the semiconductor chips and embedding the reinforcement zig.

According to an embodiment, a wafer level package may be provided. The wafer level package may include a semiconductor chip disposed on an interconnection structure layer. The wafer level package may include a reinforcement zig attached to a surface of the semiconductor chip to include at least one bar portion. The wafer level package may include a molded layer covering the semiconductor chip and embedding the reinforcement zig.

According to an embodiment, there may be provided a method of fabricating wafer level package. The method may include attaching first surfaces of semiconductor chips to a carrier. The method may include attaching a reinforcement zig to second surfaces of the semiconductor chips. The method may include forming a molded layer covering the semiconductor chips.

According to an embodiment, a semiconductor device unit may be provided. The unit may include a semiconductor chip disposed on an interconnection structure layer. The unit may include a protection layer attached to the semiconductor chip and may include a molded layer covering the semiconductor chip, and a mesh portion embedded in the molded layer.

DETAILED DESCRIPTION

Figure 1:
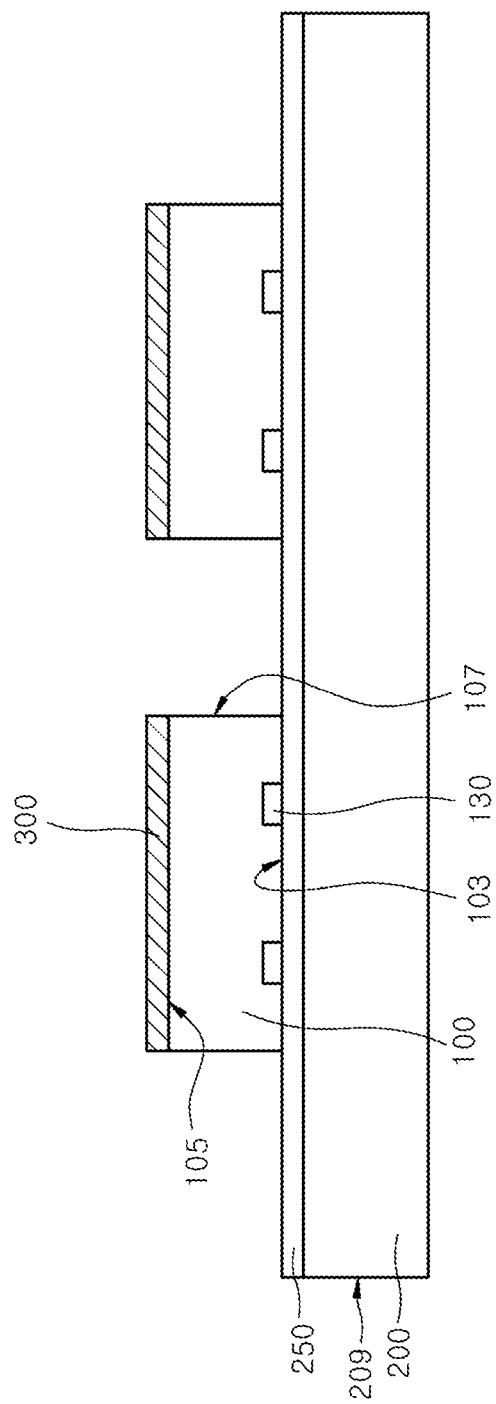
FIG. 1 is a cross-sectional view illustrating a step of attaching semiconductor chips to a carrier in an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. It will be understood that although the terms first, second, top, bottom, upper, lower etc. may be used herein to describe various elements, these elements should not be limited by these terms. These terms are only used to distinguish one element from another element, but not used to define only the element itself or to mean a particular sequence.

Semiconductor packages according to the following embodiments may include semiconductor devices such as semiconductor dies or semiconductor chips, and the separate semiconductor dies or the separate semiconductor chips may be obtained by separating a semiconductor substrate such as a semiconductor wafer including electronic circuits into a plurality of pieces (having semiconductor die shapes or semiconductor chip shapes) using a die sawing process. The semiconductor chips may correspond to memory chips such as dynamic random access memory (DRAM) chips, static random access memory (SRAM) chips, NAND-type flash memory chips, NOR-TYPE flash memory chips, magnetic random access memory (MRAM) chips, resistive random access memory (ReRAM) chips, ferroelectric random access memory (FeRAM) chips or phase change random access memory (PcRAM) chips. Alternatively, the semiconductor chips may correspond to logic chips or application specific integrated circuit (ASIC) chips. The semiconductor packages according to the following embodiments may be employed in communication systems such as mobile phones, electronic systems associated with biotechnology or health care, or wearable electronic systems.

The same reference numerals refer to the same elements throughout the specification. Thus, even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

FIG. 1 is a cross-sectional view illustrating a step of attaching semiconductor chips 100 to a carrier 200.

Referring to FIG. 1, the semiconductor chips 100 may be attached to the carrier 200 using a first adhesive layer 250. The semiconductor chips 100 may be disposed on the carrier 200 to be laterally spaced apart from each other. In an embodiment, for example, the semiconductor chips 100 may be disposed side-by-side on the carrier 200 to be spaced apart from each other. The carrier 200 may be a silicon wafer-shaped substrate or a panel-shaped substrate. The carrier 200 may be thicker than the semiconductor chips 100. The carrier 200 may act as a supporter for supporting the semiconductor chips 100 or a handling member for handling the semiconductor chips 100 during a wafer level package process.

The first adhesive layer 250 may be a ultra-violet curable pressure sensitive adhesive (UV curable PSA) layer having both of adhesive and removable characteristics. The UV curable PSA layer may be an acrylic PSA layer employing an acrylic resin component as an adhesive component. The first adhesive layer 250 may be used as a temporary adhesive for temporarily bonding the semiconductor chips 100 to the carrier 200. Thus, if UV rays are irradiated onto the first adhesive layer 250 in a subsequent process, the adhesive strength of the first adhesive layer 250 may be reduced to detach the semiconductor chips 100 from the carrier 200.

Each of the semiconductor chips 100 may have a first surface 103 facing the carrier 200 or the first adhesive layer 250, a second surface 105 being located opposite the carrier 200, and sidewalls 107 connecting the first surface 103 to the second surface 105. The first surface 103 of each semiconductor chip 100 may correspond to a front side surface adjacent to active regions in which integrated circuit elements are formed, and the second surface 105 may correspond to a backside surface of the semiconductor chip 100. The semiconductor chips 100 may include memory devices, for example, DRAM device or NAND-type flash memory devices. Alternatively, the semiconductor chips 100 may include central processing units (CPUs), graphic processing units (GPUs), microprocessors, microcontrollers, application processors, digital signal processing cores, or ASIC devices.

Chip connectors 130 may be disposed on the first surface 103 of each of the semiconductor chips 100. The chip connectors 130 may be members for electrically connecting the semiconductor chips 100 to an external device (not illustrated). The chip connectors 130 may be chip pads. The semiconductor chips 100 may be attached to the first adhesive layer 250 so that the chip connectors 130 are in contact with the first adhesive layer 250.

A second adhesive layer 300 may be formed on the second surfaces 105 of the semiconductor chips 100. The second adhesive layer 300 may be formed to cover the second surfaces 105 of the semiconductor chips 100. The second adhesive layer 300 may have an adhesive component which is different from an adhesive component of the first adhesive layer 250. For example, the second adhesive layer 300 may include an adhesive component that provides a permanent bonding which is due to a polymerization reaction. The second adhesive layer 300 may include an epoxy component.

Figure 2:
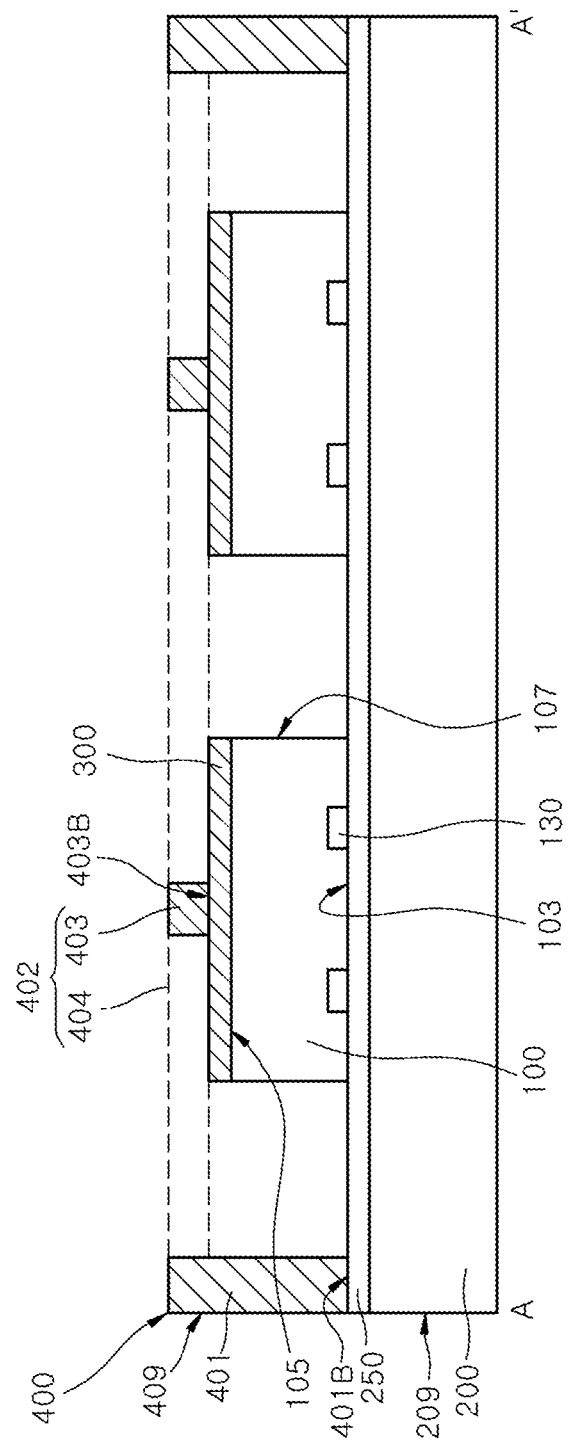
FIG. 2 is a cross-sectional view illustrating a step of attaching a reinforcement zig to semiconductor chips in an embodiment.
Figure 3:
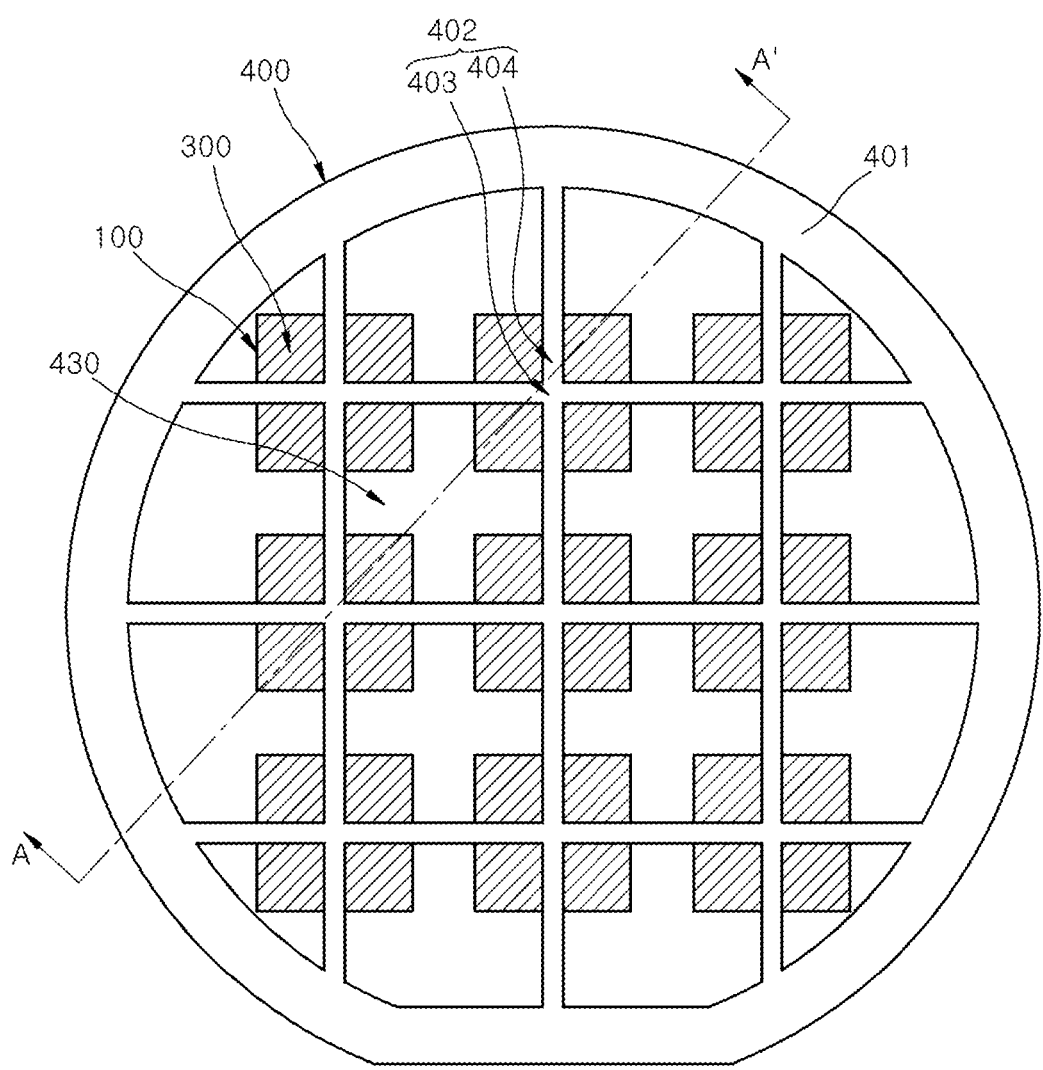
FIG. 3 is a plan view illustrating the reinforcement zig of FIG. 2.
Figure 4:
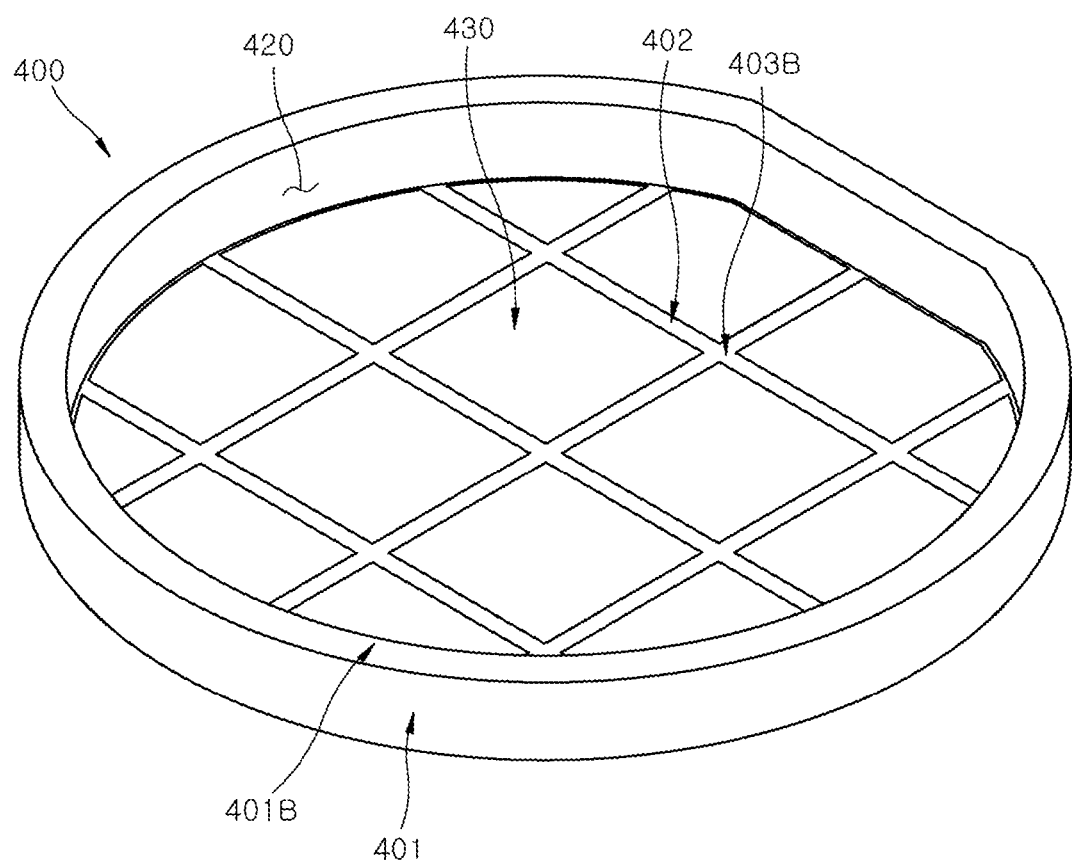
FIG. 4 is a perspective view illustrating the reinforcement zig of FIG. 2.

FIG. 2 is a cross-sectional view illustrating a step of attaching a reinforcement zig 400 to the semiconductor chips 100. FIG. 3 is a plan view illustrating the reinforcement zig 400 of FIG. 2, and FIG. 4 is a perspective view illustrating the reinforcement zig 400 of FIG. 2. FIG. 2 is a cross-sectional view taken along a line A-A' of FIG. 3.

Referring to FIG. 2, the reinforcement zig 400 may be attached to the semiconductor chips 100 using the second adhesive layer 300. The reinforcement zig 400 may be bonded to the second surfaces 105 of the semiconductor chips 100 by the second adhesive layer 300 to additionally fix the semiconductor chips 100 to the carrier 200. Referring to FIG. 3, the reinforcement zig 400 may include an edge portion 401 covering an edge of the carrier 200 having a wafer shape and a mesh portion 402 connected to the edge portion 401 to have a grid shape. The reinforcement zig 400 may have a cap-shaped feature, as illustrated in FIG. 4. The mesh portion 402 of the reinforcement zig 400 may be connected to an upper portion of the edge portion 401 to correspond to a lid portion of the reinforcement zig 400 having a cap-shaped feature. The mesh portion 402 may include a plurality of bar portions 404 that intersect each other to provide cross rib portions 403. The mesh portion 402 may provide through windows 430 that are defined by the bar portions 404 and the cross rib portions 403. The reinforcement zig 400 may provide an inner space (420 of FIG. 4) which is defined and surrounded by the edge portion 401 and the mesh portion 402. Thus, the inner space 420 may be spatially connected to an outside region of the reinforcement zig 400 through the through windows 430. Referring to FIG. 3, portions of the semiconductor chips 100 or portions of the second adhesive layer 300 formed on the semiconductor chips 100 may be exposed by the through windows 430.

Referring again to FIG. 2, the reinforcement zig 400 may be attached to the carrier 200 so that the semiconductor chips 100 are inserted into the inner space (420 of FIG. 4) defined by the edge portion 401 and the mesh portion 402. The edge portion 401 of the reinforcement zig 400 may be attached to the carrier 200 to be aligned with an edge of the carrier 200. The reinforcement zig 400 may be attached to the carrier 200 so that an outer sidewall 409 of the edge portion 401 is vertically aligned with an outer sidewall 209 of the carrier 200. If the carrier 200 is a wafer-shaped carrier, the edge portion 401 of the reinforcement zig 400 may have substantially the same feature as an edge portion a wafer as illustrated in FIGS. 3 and 4.

The first adhesive layer 250 may bond a bottom surface 401B of the edge portion 401 to the carrier 200 so that the reinforcement zig 400 is fixed to the carrier 200. An additional adhesive layer (not illustrated) may be introduced into an interface between the bottom surface 401B of the edge portion 401 and the carrier 200 or between the bottom surface 401B of the edge portion 401 and the first adhesive layer 250 so that the reinforcement zig 400 is more strongly fixed to the carrier 200.

Referring still to FIG. 2, the semiconductor chips 100 may be secondarily fixed to the reinforcement zig 400 by the second adhesive layer 300 since the second surfaces 105 of the semiconductor chips 100 are bonded to the reinforcement zig 400 by the second adhesive layer 300. Since the semiconductor chips 100 are firstly attached and fixed to specific positions of the carrier 200 by the first adhesive layer 250, the reinforcement zig 400 and the second adhesive layer 300 may secondly contribute to fixing the semiconductor chips 100 to the carrier 200. That is, the reinforcement zig 400 may act as an additional supporter for fixing the semiconductor chips 100 to the carrier 200.

Since the first adhesive layer 250 is a temporary adhesive layer for attaching the first surfaces 103 of the semiconductor chips 100 to the carrier 200, the first adhesive layer 250 may have a relatively weak adhesive strength. Thus, if only the first adhesive layer 250 is used to fix the semiconductor chips 100 to the carrier 200, the semiconductor chips 100 may be readily shifted when an external force is applied to the semiconductor chips 100.

In contrast, if the semiconductor chips 100 are attached to the reinforcement zig 400 by the second adhesive layer 300, the second adhesive layer 300 may provide an additional adhesive strength between the second surfaces 105 of the semiconductor chips 100 and bottom surfaces 403B of the cross rib portions 403. Thus, the semiconductor chips 100 may be fixed to the carrier 200 as well as the reinforcement zig 400. In such a case, since the second adhesive layer 300 provides a permanent adhesive strength due to a polymerization reaction, the semiconductor chips 100 may be more strongly fixed to the carrier 200 by the permanent adhesive strength between the second surfaces 105 of the semiconductor chips 100 and the bottom surfaces 403B of the cross rib portions 403. Because the reinforcement zig 400 enhances an adhesive strength between the semiconductor chips 100 and the carrier 200, the semiconductor chips 100 may be fixed to the carrier 200 without movement even though an external force is applied to the semiconductor chips 100. Accordingly, the reinforcement zig 400 may strongly fix the semiconductor chips 100 to predetermined positions of the carrier 200 to prevent the semiconductor chips 100 from being shifted by a molding pressure during a subsequent molding process.

The reinforcement zig 400 may be formed of one of various materials. The reinforcement zig 400 may be formed of a rigid material which is hardly deformed. For example, the reinforcement zig 400 may be formed of a stainless steel material, a metal alloy material, or a glass material. Although the reinforcement zig 400 includes the mesh portion 402 providing the through windows 430 illustrated in FIGS. 3 and 4, a shape of the mesh portion 402 is not limited thereto and may be modified to have any other shape.

Figure 5:
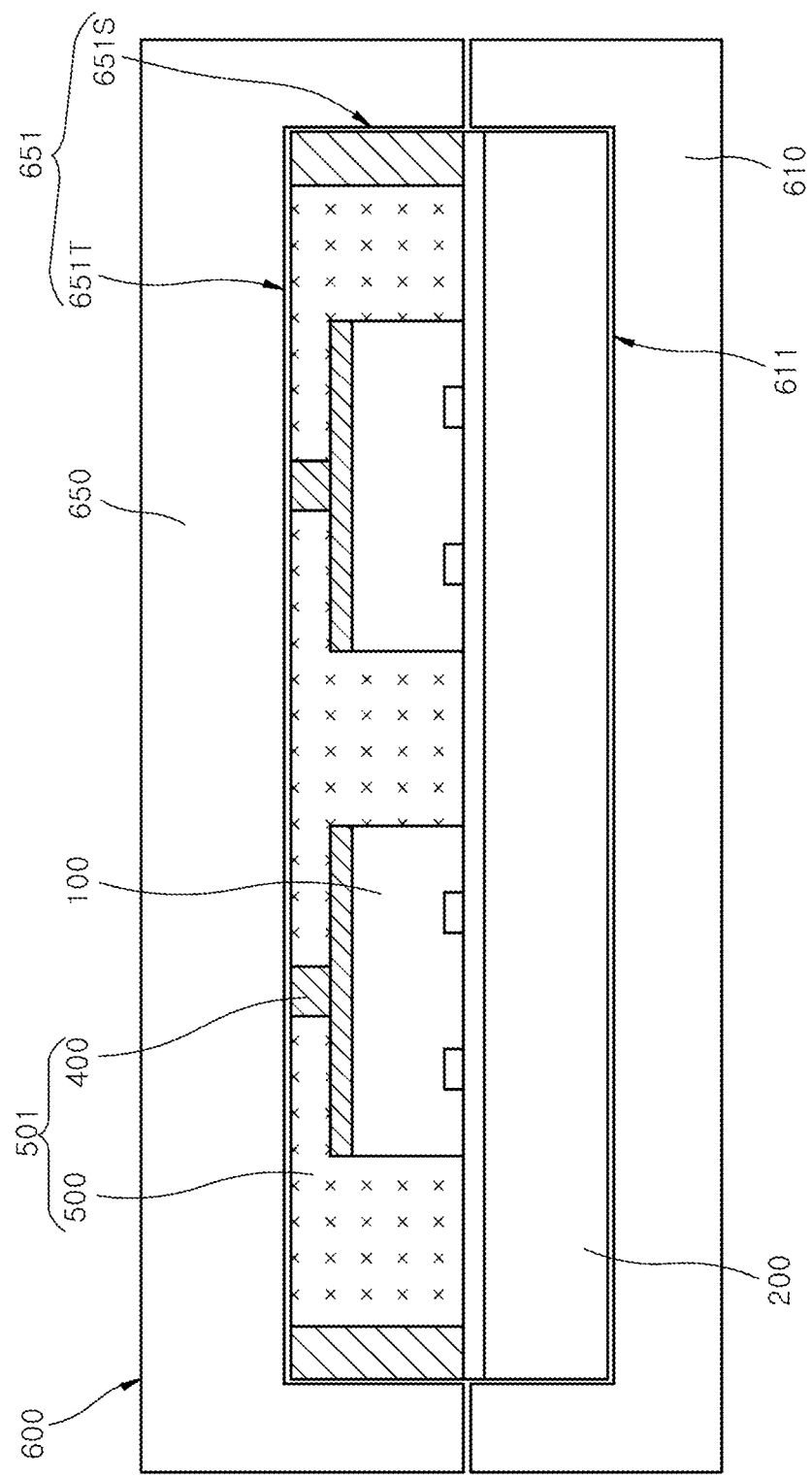
FIG. 5 is a cross-sectional view illustrating a step of forming a molded layer on a carrier in an embodiment.

FIG. 5 is a cross-sectional view illustrating a step of forming a molded layer 500 on the carrier 200.

Referring to FIG. 5, the molded layer 500 may be formed on the carrier 200 to cover the semiconductor chips 100. The molded layer 500 may be formed to include an encapsulant material, for example, an epoxy molding compound (EMC) material. The encapsulant material may include an epoxy resin material and fillers dispersed in the epoxy resin material.

The molded layer 500 may be formed using a molding process with a mold system 600. For example, the carrier 200 may be put into a lower mold 610, and an upper mold 650 may be disposed onto the lower mold 610 to form the molded layer 500. The lower mold 610 may have a groove 611 therein, and the carrier 200 may be inserted into the groove 611. The upper mold 650 may have a mold cavity 651 providing a shape of the molded layer 500, and a molding material such as an EMC material may be injected into the mold cavity 651. That is, the upper mold 650 may be combined with the lower mold 610, and a melted EMC material may be injected into the mold cavity 651 by a compressive pressure. As a result, the melted EMC material may be molded by the compression molding process to form the molded layer 500.

The molded layer 500 may be formed to fill the inner space (420 of FIG. 4) of the reinforcement zig 400. The upper mold 650 may be combined with the lower mold 610, and the melted EMC material may be injected into the mold cavity 651 of the upper mold 650 by a compressive pressure to fill the inner space (420 of FIG. 4) of the reinforcement zig 400. The melted EMC material may be injected into the inner space (420 of FIG. 4) of the reinforcement zig 400 via the through windows (430 of FIG. 3) defined by the mesh portion (402 of FIGS. 3 and 4) of the reinforcement zig 400.

The reinforcement zig 400 attached to the carrier 200 and the semiconductor chips 100 may be in contact with a top surface 651T and a sidewall 651S of the mold cavity 651 while the compression molding process is performed. The outer sidewall 409 of the edge portion 401 of the reinforcement zig 400 may face and contact the sidewall 651S of the mold cavity 651, and the mesh portion 402 of the reinforcement zig 400 may contact the top surface 651T of the mold cavity 651. Since the molded layer 500 is formed to fill the through windows 430 of the reinforcement zig 400, the mesh portion 402 of the reinforcement zig 400 may be embedded in the molded layer 500.

The mesh portion 402 of the reinforcement zig 400 embedded in the molded layer 500 and the molded layer 500 may constitute a protection layer 501 that protects the semiconductor chips 100. Thus, a portion of the reinforcement zig 400, for example, the mesh portion 402 may remain as a portion of the protection layer 501. Accordingly, a volume percentage of the molded layer 500 to an entire portion of the package may be reduced.

The mesh portion 402 or an entire portion of the reinforcement zig 400 may be comprised of a material having a thermal expansion coefficient which is lower than a thermal expansion coefficient of the molded layer 500. For example, if the reinforcement zig 400 is comprised of a stainless steel material, a metal alloy material or a glass material, a thermal expansion coefficient of the reinforcement zig 400 may be lower than a thermal expansion coefficient of the molded layer 500 comprised of an EMC material. In such a case, since a volume percentage of the molded layer 500 having a relatively high coefficient of thermal expansion is reduced as described above, thermal expansion or thermal shrinkage of the protection layer 501 may be suppressed. In addition, the mesh portion 402 or an entire portion of the reinforcement zig 400 may be formed of a stainless steel material, a metal alloy material, or a glass material which is more rigid than the molded layer 500. Thus, a body strength of the protection layer 501 may be improved.

In conclusion, the thermal expansion or the thermal shrinkage of the protection layer 501 surrounding the semiconductor chips 100 may be reduced to effectively suppress the warpage of the protection layer 501 and the carrier 200. If the protection layer 501 and the carrier 200 are warped, it may be difficult to perform subsequent package processes. However, according to the present embodiments, the warpage of the protection layer 501 and the carrier 200 may be effectively suppressed to prevent process defects from being generated.

Furthermore, while the molded layer 500 is formed, a mold material such as an EMC material may be injected into the inner space (420 of FIG. 4) of the reinforcement zig 400 by a compressive pressure. In such a case, an external force may be applied to the semiconductor chips 100. If only the first adhesive layer 250 is used to fix the semiconductor chips 100 to the carrier 200, the external force generated by the injection of the mold material may be stronger than the adhesive strength of the first adhesive layer 250. As a result, the semiconductor chips 100 may be shifted or moved to cause process failure. That is, the semiconductor chips 100 may move due to a molding pressure during the molding process. In such a case, a distance between the semiconductor chips 100 may change to cause errors of a subsequent lithography process for forming trace patterns.

For example, if the positions of the semiconductor chips 100 attached to the carrier 200 change, alignment errors may occur during a subsequent lithography process. That is, if the positions of the semiconductor chips 100 attached to the carrier 200 change during the molding process, it may be difficult to accurately sense the positions of the semiconductor chips 100 during a subsequent lithography process. Thus, in a subsequent lithography process for forming trace patterns, alignment errors may occur to cause malfunction of packages.

However, according to a present embodiment, the semiconductor chips 100 may be fixed to the carrier 200 by the first adhesive layer 250 and may be fixed to the reinforcement zig 400 by the second adhesive layer 300. Thus, a total adhesive strength produced by the first and second adhesive layers 250 and 300 may be stronger than the external force applied to the semiconductor chips 100 during the molding process. Accordingly, the semiconductor chips 100 may be fixed to the carrier 200 without any movement even though the molding process is performed. In addition, since the semiconductor chips 100 are fixed to the mesh portion 402 of the reinforcement zig 400 by the second adhesive layer 300, an initial distance between the semiconductor chips 100 may be maintained even after the molding process is performed. Thus, no alignment errors may occur during a subsequent lithography process for forming trace patterns. Accordingly, the trace patterns may be accurately formed to provide reliable packages.

Figure 6:
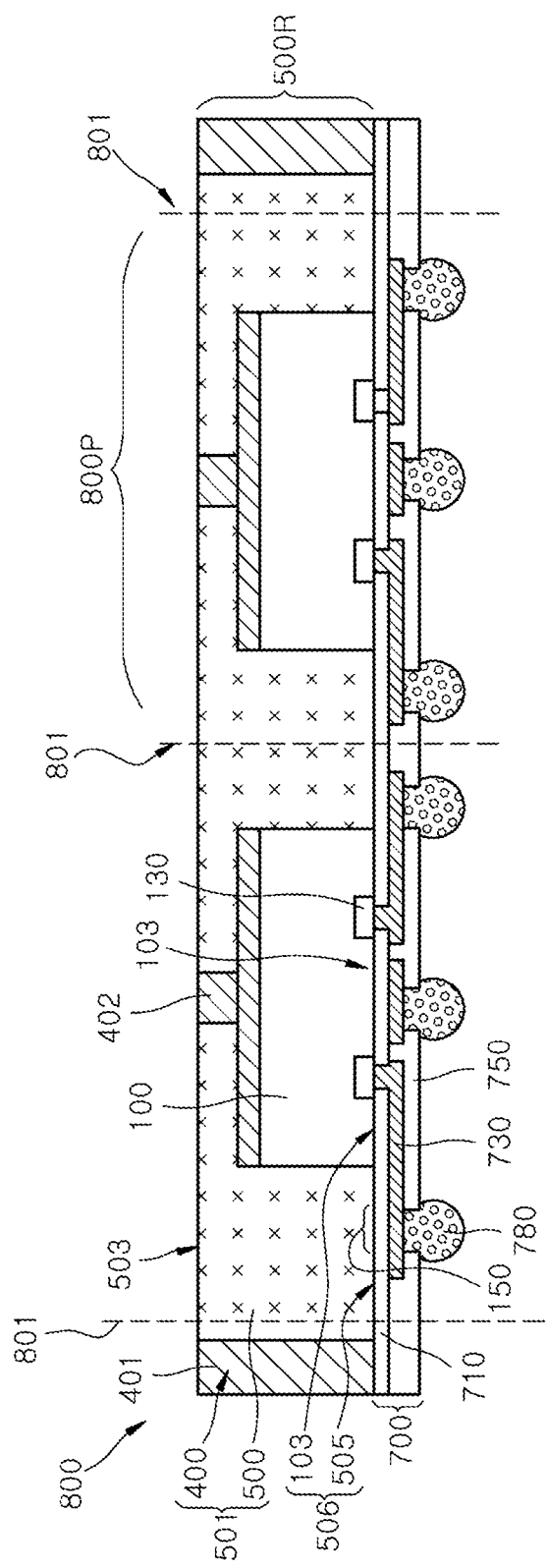
FIG. 6 is a cross-sectional view illustrating a fan-out wafer level packages (FOWLPs) according to an embodiment.

FIG. 6 is a cross-sectional view illustrating wafer level packages, for example, fan-out wafer level packages (FOWLPs) including trace patterns 730 electrically connected to the semiconductor chips 100.

Referring to FIG. 6, after the molded layer 500 is formed, the mold system (600 of FIG. 5) may be removed. Subsequently, the carrier 200 may be detached from a reconfiguration wafer 500R including the molded layer 500. The reconfiguration wafer 500R may be a resultant of the molding process. The reconfiguration wafer 500R may include the semiconductor chips 100, the molded layer 500, and the reinforcement zig 400. UV rays may then be irradiated onto the first adhesive layer 250 so that the first adhesive layer 250 loses its adhesive strength. After UV rays are irradiated onto the first adhesive layer 250, the carrier 200 may be detached from the semiconductor chips 100 to obtain the reconfiguration wafer 500R.

The first surfaces 103 of the semiconductor chips 100 may be substantially coplanar with a third surface 505 of the molded layer 500, which is adjacent to the first surfaces 103. The first surfaces 103 of the semiconductor chips 100 and the third surface 505 of the molded layer 500 may constitute a fourth surface 506 of the reconfiguration wafer 500R, which is substantially flat. Top surfaces of the molded layer 500 and the reinforcement zig 400 may constitute a fifth surface 503 of the reconfiguration wafer 500R opposite to the fourth surface 506. That is, the molded layer 500 and the reinforcement zig 400 may be exposed at the fifth surface 503 of the reconfiguration wafer 500R. An interconnection structure layer 700 may be formed on the fourth surface 506 of the reconfiguration wafer 500R to electrically connect the semiconductor chips 100 to an external device. In an embodiment, for example, the semiconductor chips 100 may be disposed on the interconnection structure layer 700 and may be laterally spaced apart from each other. In an embodiment, for example, the semiconductor chips 100 may be disposed side-by-side on the interconnection structure layer 700 and may be laterally spaced apart from each other.

A first dielectric layer 710 may be formed on the fourth surface 506 of the reconfiguration wafer 500R. The first dielectric layer 710 may be formed to expose the chip connectors 130. The trace patterns 730 may be formed on a surface of the first dielectric layer 710 opposite to the molded layer 500. The trace patterns 730 may be formed to be in direct contact with the chip connectors 130, respectively. Some of the trace patterns 730 may extend to overlap with the third surface 505 of the molded layer 500. The trace patterns 730 may be formed of a conductive material including a copper material or a copper alloy material. A second dielectric layer 750 may be formed on a surface of the first dielectric layer 710 to cover the trace patterns 730. The second dielectric layer 750 may be formed to expose portions of the trace patterns 730. Outer connection terminals 780 may be attached to the exposed portions of the trace patterns 730. The outer connection terminals 780 may be solder balls or solder bumps.

Since some of the trace patterns 730 may extend to overlap with the third surface 505 of the molded layer 500, some of the outer connection terminals 780 may be formed on a region 150 of the molded layer 500. Since some of the outer connection terminals 780 are formed to overlap with the third surface 505 of the molded layer 500, a wafer level package 800 having a fan-out package structure may be realized. In some embodiments, for example, a wafer level package 800 may have a fan-out package structure and may, thus, be a fan-out wafer level package (FOWLP). In some embodiments, for example, a wafer level package 800 may have a discrete fan-out wafer level package structure and may, thus, be a discrete FOWLP.

The wafer level package 800 may include the interconnection structure layer 700, the semiconductor chips 100, the reinforcement zig 400, and the molded layer 500. The mesh portion 402 of the reinforcement zig 400 may include the bar portions 404 and the cross rib portions 403 corresponding to cross points of the bar portions 404, as illustrated in FIG. 3. Although FIG. 3 illustrates an example in which the bar portions 404 intersect each other to provide the cross rib portions 403, the present disclosure is not limited thereto. For example, in some embodiments, the bar portions 404 may be disposed in parallel without the cross rib portions 403 to provide the reinforcement zig 400. The second adhesive layer 300 may be formed on all of the semiconductor chips 100 to bond the semiconductor chips 100 to the mesh portion 402 of the reinforcement zig 400. Thus, all of the semiconductor chips 100 may be bonded and fixed to the mesh portion 402 of the reinforcement zig 400.

After the interconnection structure layer 700 is formed on the reconfiguration wafer 500R, a singulation process may be applied to the interconnection structure layer 700 and the reconfiguration wafer 500R to provide a plurality of units 800P of the wafer level package 800 which are separated from each other. The singulation process may be performed by cutting the interconnection structure layer 700 and the reconfiguration wafer 500R along a cutting line 801.

Figure 7:
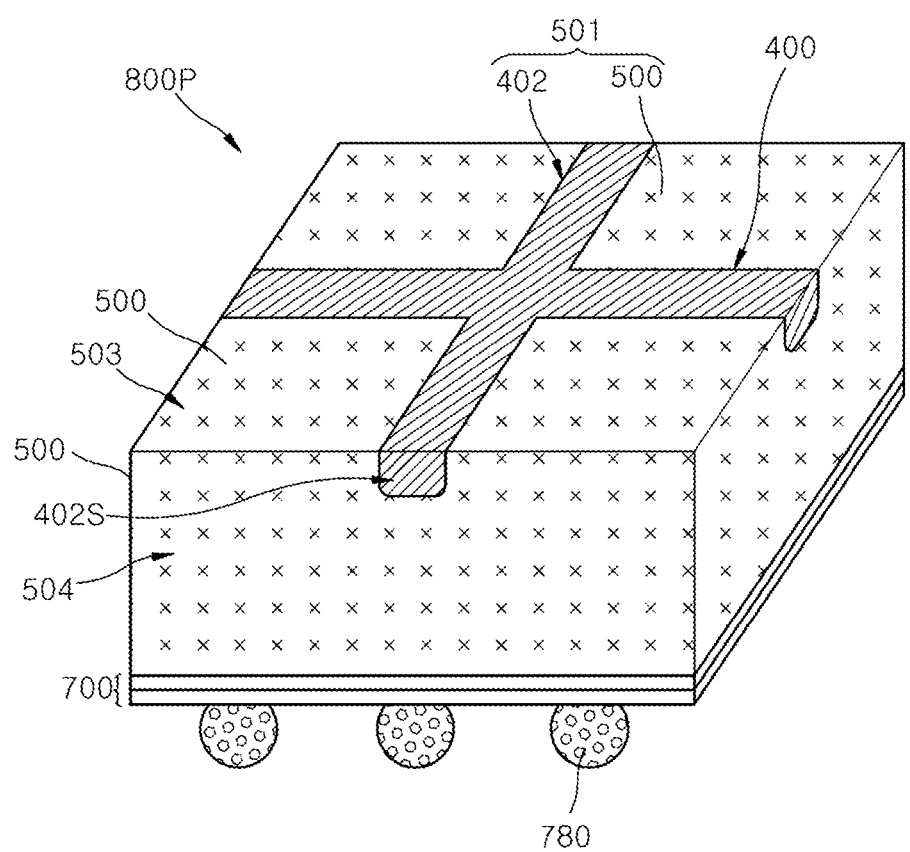
FIG. 7 is a perspective view illustrating a fan-out wafer level package (FOWLP) according to an embodiment.

FIG. 7 is a perspective view illustrating any one of the units 800P of the wafer level package 800 obtained by the singulation process described with reference to FIG. 6. In an embodiment, for example, the wafer level package 800 may be a discrete FOWLP.

Referring to FIG. 7, the unit 800P of the wafer level package 800 may be separated from the reconfiguration wafer 500R and may include the semiconductor chip 100 disposed on the interconnection structure layer 700, the reinforcement zig 400 may be attached to a surface of the semiconductor chip 100 to have a cross shape, and the molded layer 500 may be covering the semiconductor chip 100 and embedding the reinforcement zig 400. In the unit 800P of the wafer level package 800, portions of the reinforcement zig 400, for example, sidewalls 402S of the mesh portion 402 may be exposed at sidewalls 504 of the molded layer 500. The mesh portion 402 may be embedded in the molded layer 500, and a top surface (corresponding to the fifth surface 503 of the reconfiguration wafer 500R) of the molded layer 500 may be coplanar with a top surface of the mesh portion 402. The mesh portion 402 remaining in the unit 800P may increase the body strength of the protection layer 501 which is comprised of the mesh portion 402 and the molded layer 500.

Figure 8:
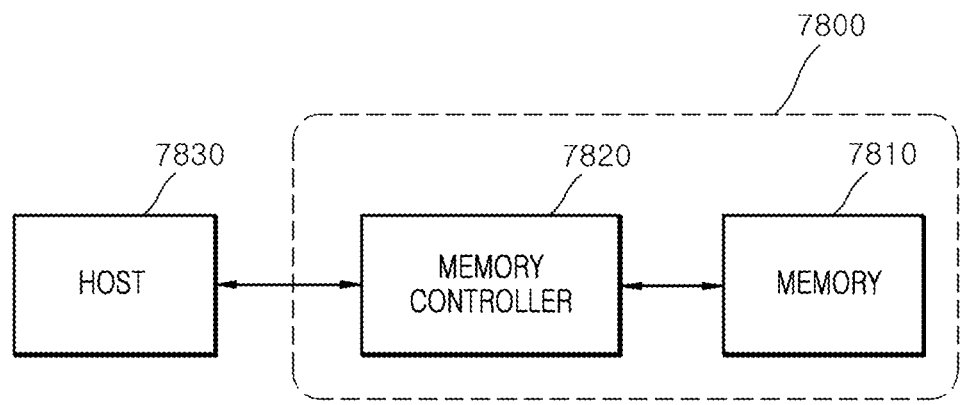
FIG. 8 is a block diagram illustrating an electronic system employing a memory card including a package according to an embodiment.

FIG. 8 is a block diagram illustrating an electronic system including a memory card 7800 including at least one of the packages according to an embodiment. The memory card 7800 includes a memory 7810, such as a nonvolatile memory device, and a memory controller 7820. The memory 7810 and the memory controller 7820 may store data or read stored data. The memory 7810 and/or the memory controller 7820 may include at least one of the wafer level packages and or units according to an embodiment.

The memory 7810 may include a nonvolatile memory device to which the technology of the embodiments of the present disclosure is applied. The memory controller 7820 may control the memory 7810 such that stored data is read out or data is stored in response to a read and write (read/write) request from a host 7830.

Figure 9:
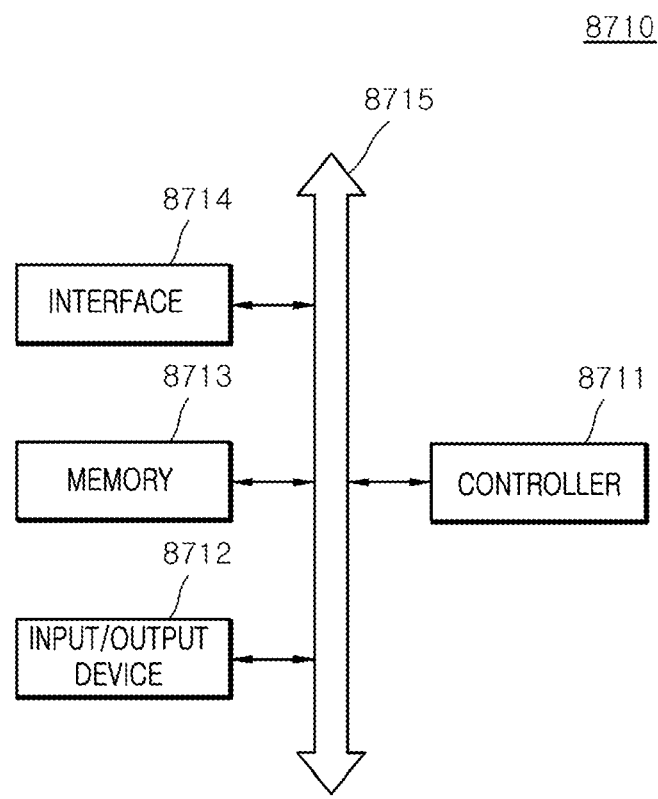
FIG. 9 is a block diagram illustrating an electronic system including a package according to an embodiment.

FIG. 9 is a block diagram illustrating an electronic system 8710 including at least one of the wafer level packages and or units according to the embodiments. The electronic system 8710 may include a controller 8711, an input and output (input/output) device 8712, and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the wafer level packages and or units according to the embodiments of the present disclosure. The input/output unit 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A wafer level package comprising:
semiconductor chips disposed side-by-side on an interconnection structure layer;
a reinforcement zig attached on the semiconductor chips; and
a molded layer covering the semiconductor chips and embedding the reinforcement zig,
wherein the reinforcement zig includes:
bar portions attached on the semiconductor chips; and
an edge portion directly connected to the bar portions.

2. The wafer level package of claim 1,
wherein the bar portions intersect each other to provide a mesh portion having a grid shape; and
wherein the semiconductor chips are disposed in an inner space which is surrounded and defined by the mesh portion and the edge portion.

3. The wafer level package of claim 1, wherein the edge portion of the reinforcement zig extends to cover a sidewall of the molded layer.

4. The wafer level package of claim 1, wherein the reinforcement zig includes a stainless steel material, an alloy material, or a glass material.

5. The wafer level package of claim 1, wherein the reinforcement zig has a coefficient of thermal expansion which is lower than a coefficient of thermal expansion of the molded layer.

6. The wafer level package of claim 1, wherein the reinforcement zig includes a material which is more rigid than the molded layer.

7. The wafer level package of claim 1, further comprising an adhesive layer disposed between the reinforcement zig and each of the semiconductor chips to permanently bond the semiconductor chips to the reinforcement zig.

8. The wafer level package of claim 7, wherein the adhesive layer is disposed on all of the semiconductor chips.

9. The wafer level package of claim 1,
wherein the interconnection structure layer includes trace patterns for electrically connecting the semiconductor chips to an external device; and
wherein at least one of the trace patterns extends to overlap with molded layer.

10. The wafer level package of claim 1,
wherein the interconnection structure layer includes trace patterns for electrically connecting the semiconductor chips to outer connection terminals; and
wherein at least one of the trace patterns extends to overlap with molded layer.

11. A wafer level package comprising:
a semiconductor chip disposed on an interconnection structure layer;
a reinforcement zig attached on a surface of the semiconductor chip to include at least one bar portion; and
a molded layer covering the semiconductor chip and embedding the reinforcement zig,
wherein the at least one bar portion includes two bar portions; and
wherein the two bar portions intersect each other to provide a mesh portion corresponding to the reinforcement zig.

12. The wafer level package of claim 11, wherein the reinforcement zig includes a stainless steel material, an alloy material, or a glass material.

13. The wafer level package of claim 11, wherein the reinforcement zig has a coefficient of thermal expansion which is lower than a coefficient of thermal expansion of the molded layer.

14. The wafer level package of claim 11, wherein the reinforcement zig includes a material which is more rigid than the molded layer.

15. A semiconductor device unit comprising:
a semiconductor chip disposed on an interconnection structure layer; and
a protection layer attached to the semiconductor chip and including:
a molded layer covering the semiconductor chip; and
a mesh portion disposed on the semiconductor chip and embedded in the molded layer,
wherein the mesh portion substantially has a cross shape.

16. The semiconductor device unit of claim 15, wherein sidewalls of the mesh portion are exposed at sidewalls of the molded layer.

17. The semiconductor device unit of claim 15, wherein a top surface of the mesh portion is coplanar with a top surface of the molded layer.

* * * * *